(12) United States Patent
Abe (10) Patent No.: US 7,393,724 B2
(45) Date of Patent: Jul. 1, 2008

(54) REDUCED DIELECTRIC BREAKDOWN/LEAKAGE SEMICONDUCTOR DEVICE AND A METHOD OF MANUFACTURING THE SAME, INTEGRATED CIRCUIT, ELECTRO-OPTICAL DEVICE, AND ELECTRIC APPARATUS

(75) Inventor: Daisuke Abe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 136 days.

(21) Appl. No.: 11/107,935

(22) Filed: Apr. 18, 2005

(65) Prior Publication Data

US 2006/0017053 A1 Jan. 26, 2006

(30) Foreign Application Priority Data

Jul. 26, 2004 (JP) ............................. 2004-217448

(51) Int. Cl.
*H01L 21/00* (2006.01)
*H01L 21/84* (2006.01)

(52) U.S. Cl. ...................... 438/149; 438/479; 438/517; 257/E21.415

(58) Field of Classification Search ................ 438/149, 438/151, 479, 517; 257/347, E21.415, E21.416
See application file for complete search history.

(56) References Cited

U.S. PATENT DOCUMENTS

2003/0189228 A1\* 10/2003 Ieong et al. ................. 257/347

FOREIGN PATENT DOCUMENTS

| JP | A-6-291308 | 10/1994 |
| JP | A-08-088363 | 4/1996 |
| JP | A 2000-040828 | 2/2000 |
| JP | 2001-135823 | \* 5/2001 |

\* cited by examiner

*Primary Examiner*—Thien F Tran
(74) *Attorney, Agent, or Firm*—Oliff & Berridge, PLC (57) ABSTRACT

Aspects of the invention provide a method, in a semiconductor device, such as a thin film transistor, a technology capable of preventing or reducing the electric field concentration at the edge section of the semiconductor film to enhance the reliability. The method of manufacturing a semiconductor device according to the invention can include a first step of forming a semiconductor film discretely on an insulation substrate, a second step of covering the semiconductor film including an edge section of the semiconductor film with a first insulation film, a third step of opening the first insulation film above the semiconductor film excluding the edge section of the semiconductor film, a fourth step of forming a second insulation film thinner than the first insulation film on the semiconductor film corresponding to at least the opening of the first insulation film, and a fifth step of forming an electrode wiring film on the second insulation film.

4 Claims, 5 Drawing Sheets

REDUCED DIELECTRIC BREAKDOWN/LEAKAGE SEMICONDUCTOR DEVICE AND A METHOD OF MANUFACTURING THE SAME, INTEGRATED CIRCUIT, ELECTRO-OPTICAL DEVICE, AND ELECTRIC APPARATUS

BACKGROUND

Aspects of the invention can relate to an improvement technology of a field-effect semiconductor device, such as a MOS transistor. Research and development of a technology of forming a thin film transistor having high current drive efficiency using a crystalline semiconductor film (e.g., polycrystalline silicon film) formed by a low-temperature process is in progress. In general, polycrystalline silicon films are formed by crystallizing amorphous silicon films by irradiating with laser thereto. However, the polycrystalline silicon films thus formed tend to have larger roughness in surfaces thereof because of protrusions formed of boundaries (grain boundaries) of crystal grains grown at various portions during the crystallization. In a thin film field-effect transistor (TFT) formed by depositing a gate insulation film and a gate electrode on the upper side of the polycrystalline silicon film, electric field is apt to be concentrated to the protrusions of the surface of the polycrystalline silicon film to cause dielectric breakdown of the gate insulation film. In view of such a problem, Japanese Patent Publication No. 2000-40828, for example, discloses a technology for preventing the dielectric breakdown of the gate insulation film in the thin film transistor by grinding to planarize the surface of the formed polycrystalline silicon film.

Incidentally, if the thickness of the gate insulation film is made thinner in order to enhance miniaturization of thin film transistors, the gate insulation film is apt to have a thinner part in the edge of the semiconductor film. In particular, when the gate insulation film is formed using a film deposition method having the low step-coverage capability, such as a sputtering process or a CVD process, the tendency of the above becomes marked. If the gate electrode is formed so as to traverse the edge portion, the electric field concentration occurs at that portion to cause the dielectric breakdown very often. Thus, inconvenience of degrading the reliability of the thin film transistor can occur. In the related art technology described above, it is difficult to achieve relaxation of such electric field concentration at the edge portion of the semiconductor film, and therefore, a further improved technology has been desired.

SUMMARY

Aspects of the invention can enhance reliability of semiconductor devices by preventing or reducing the dielectric breakdown or leakage from occurring at the edge portion of the semiconductor film in the semiconductor devices such as thin film transistors.

In order for obtaining the above advantage, an exemplary method of manufacturing a semiconductor device can include a first step of forming a semiconductor film discretely on an insulation substrate, a second step of covering the semiconductor film including an edge section of the semiconductor film with a first insulation film, a third step of opening the first insulation film above the semiconductor film excluding the edge section of the semiconductor film, a fourth step of forming a second insulation film thinner than the first insulation film on the semiconductor film corresponding to at least the opening of the first insulation film, and a fifth step of forming an electrode wiring film on the second insulation film. By manufacturing the semiconductor device with such manufacturing processes, portions at which the electric field is concentrated can be removed from the gate insulation film, thus enhancement of reliability of the gate insulation film can be achieved.

Preferably, the first step can further include the steps of forming the semiconductor film on the insulation substrate, polycrystallizing the semiconductor film by a heat treatment, planarizing a surface of the polycrystallized semiconductor film, and patterning the polycrystallized semiconductor film to form an element forming region. Thus, the polycrystalline semiconductor film with a flat surface can be obtained to prevent portions, at which the electric field is concentrated, in the gate insulation film from appearing due to the irregularity of the surface of the semiconductor film.

Preferably, the fourth step described above is the step of forming the second insulation film by thermal oxidation of the upper surface of the semiconductor film. Thus, the gate insulation film thin and superior in insulation property can be obtained.

Further, the fourth step described above is the step of forming the second insulation film by depositing (film-forming) an insulation material on the semiconductor film. Thus, the gate insulation film can be formed on the semiconductor film without reducing the thickness of the semiconductor film.

Further, the exemplary semiconductor device according to the invention can be equipped with a semiconductor film formed discretely on an insulation substrate, an area separating and insulating film formed on the insulation substrate so as to have an opening on the semiconductor film and to surround the periphery of the semiconductor film including an edge section thereof, a gate insulation film formed thinner than the area separating and insulating film on the upper surface of the semiconductor film corresponding to at least the opening of the area separating and insulating film, and a gate electrode formed on the gate insulation film. By adopting such a configuration, portions at which the electric field is concentrated can be removed from the gate insulation film, thus the semiconductor device with enhanced reliability of the gate insulation film can be achieved.

Preferably, the gate insulation film can be formed on the upper surface of the semiconductor film displaced from the edge section of the semiconductor film. Thus, the portions with intense electric field can be prevented or reduced from appearing in the gate insulation film.

Preferably, the area separating and insulating film can be formed to have a thickness at least more than twice of that of the gate insulation film. Thus, a sufficient insulation property can be ensured to the area separating and insulating film.

Further, the integrated circuit, the electro-optic device, or the electronic apparatus according to the invention is equipped with the semiconductor device having the configuration described above.

According to the invention, since the gate insulation film is formed around the edge section of the semiconductor film, the breakdown of the gate insulation film caused by the local electric field concentration can be prevented or reduced.

BRIEF DESCRIPTION OF THE DRAWINGS

This invention will be described with reference to the accompanying drawings, wherein like numerals reference like elements, and wherein.

DETAILED DESCRIPTION OF EMBODIMENTS

Hereinafter, exemplary embodiments of the invention will be described.

Figure 1:
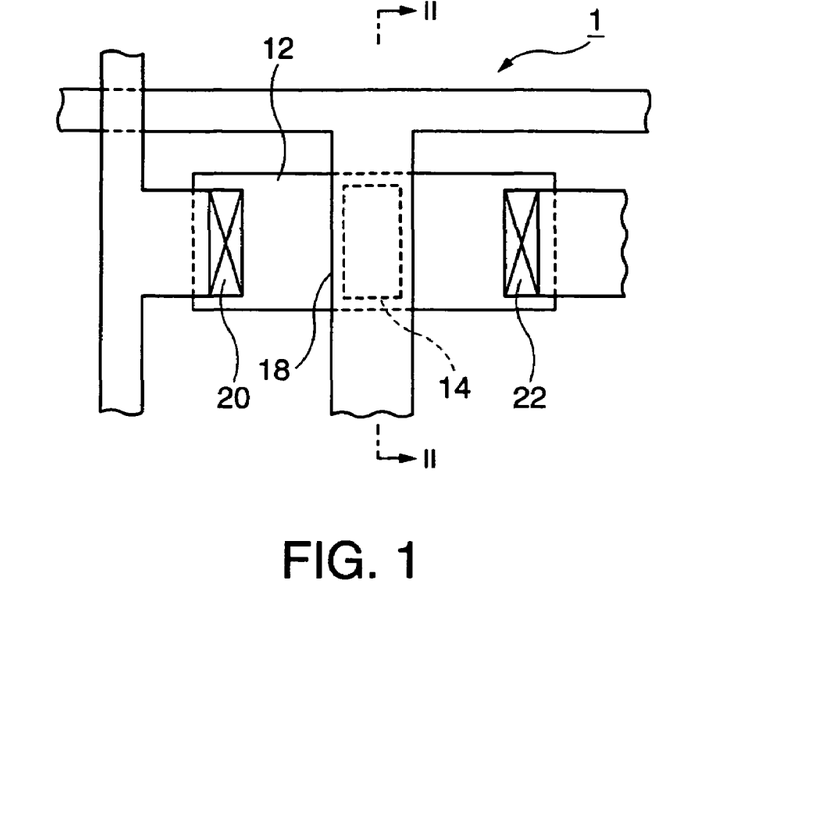
FIG. 1 is a plan view for explaining a structure of a thin film transistor of a exemplary embodiment.
Figure 2:
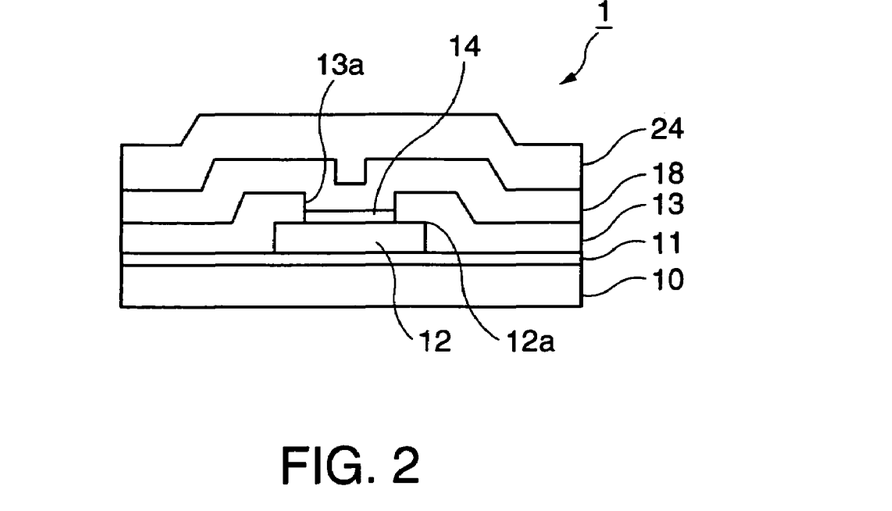
FIG. 2 is a cross-sectional view of the thin film transistor shown in FIG. 1 along the II-II direction (a channel width direction) in the same drawing.

FIG. 1 is a plan view for explaining the structure of a thin film transistor as a semiconductor device of the exemplary embodiment according to the invention. FIG. 2 is a cross-sectional view of the thin film transistor along the II-II line direction in the drawing of the thin film transistor shown in FIG. 1. In both of the drawings, the corresponding sections are denoted with the same reference numerals. The thin film transistor is used as, for example, a pixel driver element for an organic EL display device, a liquid crystal display device and so on.

As shown in FIGS. 1 and 2, the thin film transistor 1 is a field-effect transistor having a laminated structure (MOS structure) formed by stacking a semiconductor film, an insulation film, and an electrode, and composed of an insulation substrate having an insulation film 11 formed on a substrate 10, semiconductor films 12 formed discretely, an insulation film (first insulation film) 13 for separating the semiconductor films, a gate insulation film (second insulation film) 14, a gate electrode 18, a source electrode 20, a drain electrode 22, and an insulation film (protection film) 24.

The substrate 10 is a substrate made of, for example, glass, quartz glass, or plastic. The insulation film 11 is a primer insulation film, such as a silicon oxide film or silicon nitride film. The insulation film 11 electrically insulates the semiconductor films 12 and prevents or reduces impurities from entering from the substrate 10 into the semiconductor films 12.

The semiconductor film 12 assumes an active region of the thin film transistor and is made of a crystalline semiconductor film. In the exemplary embodiment, a polycrystalline silicon film (polysilicon film) can be used as the semiconductor film 12.

The insulation film 13 surrounds the periphery of the discrete semiconductor films 12 formed discretely on the substrate 10, and insulates the semiconductor films 12 from other semiconductor films not shown to separate the element regions. Further, the insulation film 13 is formed so as to cover an edge section 12a of the semiconductor film 12 to expose (open) the upper surface of the edge section 12a. The insulation film 13 is formed to have substantially the same thickness as the semiconductor film 13. As the insulation film 13, for example, a silicon oxide ($SiO_2$) film, a silicon nitride ($Si_3N_4$) film, or phosphorus silicate glass (PSG) film can be preferably used. The insulation film 13 needs to be formed as a relatively thick film, but is not required to have characteristics of an insulation voltage and a fixed charge density as required to the gate insulation film 14. Therefore, it can be formed with production conditions suitable for high-speed film deposition.

The gate insulation film 14 is formed so as to cover the upper surface of the semiconductor films 12 exposed from the opening sections of the insulation film 13. In this embodiment, an insulation film made of silicon oxide is formed by oxidizing the exposed semiconductor film 12 under a plasma atmosphere to obtain the gate insulation film 14. As the gate insulation film 16, for example, a silicon nitride ($Si_3N_4$) film or the like can be formed. The gate insulation film 16 has little necessity of formed as a thick film, but is required to have superior characteristics of an insulation voltage, a fixed charge density, and so on. Therefore, it is formed adopting production conditions (generally for low-speed film deposition) capable of obtaining better film characteristics. As described below, the gate insulation film 14 can be formed using a deposition process, such as CVD.

The gate insulation film 14, which is separated from the edge section 12a of the semiconductor film 12, becomes difficult to be effected by the local high electric field generated adjacent to the edge section 12a, thus the dielectric breakdown can be prevented.

The gate electrode 18 is formed so as to pass above the insulation film 13 and the gate insulation film 14, and also above a predetermined position of the semiconductor film 12. In further detail, the gate electrode 18 is formed so as to traverse two parallel sides of the semiconductor film 12 as shown in FIG. 1. The gate electrode 18 is made of an electrically conductive film such as, for example, tantalum, chromium, or aluminum.

Both of the source electrode 20 and the drain electrode 22 respectively pass through the insulation film 24 to be connected to the semiconductor film 12. These source electrodes 20 are composed of electrically conductive films made of, for example, aluminum.

The insulation film 24 is formed so as to cover the upper surface of the gate electrode 18, the insulation film 16, and so on. The insulation film 24 assumes as a protective film, and a silicon oxide ($SiO_2$) film, a silicon nitride ($Si_3N_4$) film, phosphorus silicate glass (PSG) film, or the like is preferably used therefor.

Figure 3A:
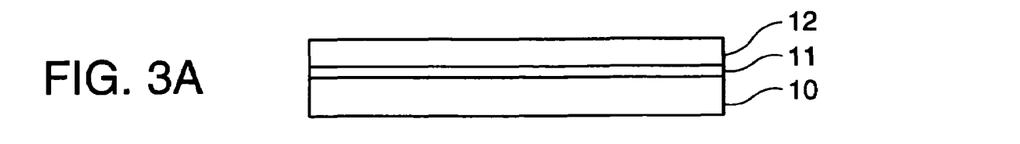
FIGS. 3A through 3G are views for explaining a manufacturing method of a thin film transistor.

Hereinafter, a manufacturing method of the semiconductor device described above will be explained with reference to process charts shown in FIGS. 3A through 3G Firstly, as shown in FIG. 3A, the insulation film 11 made of silicon oxide ($SiO_2$) is formed on the glass substrate 10 by, for example, a plasma CVD process.

Then, an amorphous silicon film is deposited as the semiconductor film 12 thereon by a film forming process such as a PECVD process, a LPCVD process, an atmospheric pressure chemical vapor deposition process (APCVD process), or a sputtering process. By executing a process of irradiating the amorphous silicon film with excimer laser or the like (a laser annealing process), the amorphous silicon film is transformed to a polysilicon film. In this case, on the surface of the polysilicon film obtained by the crystallization process by the laser irradiation, there is often provided irregularity 30 caused by protrusions of the boundaries of respective crystal grains (grain boundaries).

Therefore, it is preferable that the semiconductor film 12 is ground to have the irregularity of the surface thereof be planarized. In the present, the processes are executed adopting a CMP process (chemical mechanical polishing process). As preferable conditions for polishing by the CMP process, for example, a pad made of soft polyurethane and abrasive (slurry) obtained by dispersing silica particles in ammonia based or amine based alkaline solution are used in combination adopting the conditions of 30000 Pa of pressure, 50 rpm of rotational speed, and 200 sccm of flow rate.

Figure 3B:
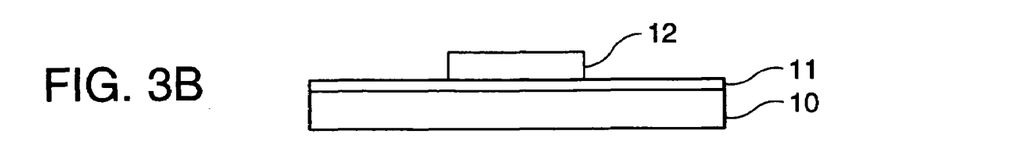

Subsequently, as shown in FIG. 3B, the discrete semiconductor film 12 composed of the polysilicon film can be formed in the predetermined element forming region on the substrate 10 by executing on the planarized semiconductor film 12 a pattern forming process (patterning) including a photoresist deposition process, a pattern exposing process, a development process, an etching process, and so on.

Figure 3C:
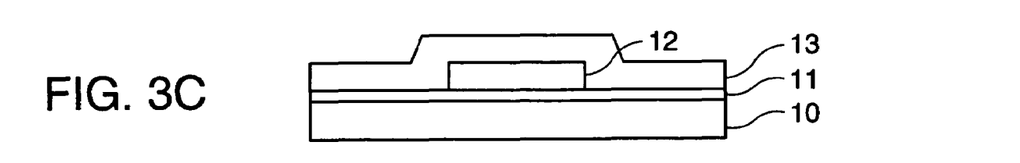

As shown in FIG. 3C, the insulation film 13 for separating elements can be formed on the insulation film 11 and the semiconductor film 12. The insulation film 13 can be obtained by forming, for example, a silicon oxide ($SiO_2$) film, a silicon nitride ($Si_3N_4$) film, or phosphorus silicate glass (PSG) film by the PECVD process. The insulation film 13 is formed so as to be thicker enough at the edge section of the semiconductor film 12 than the gate insulation film 14 in the process described below. For example, it is formed to have the film thickness more than double of the thickness of the gate insulation film 14.

Figure 3D:
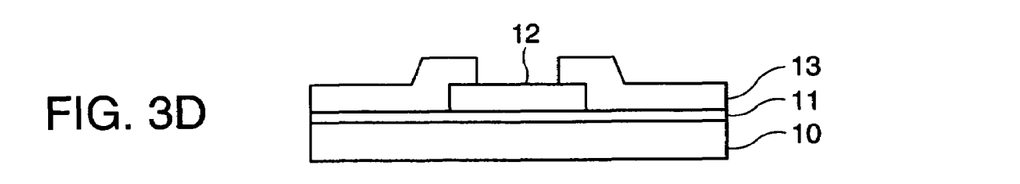

As shown in FIG. 3D, a patterning is provided on the insulation film to open the upper surface of the semiconductor film 12 except the edge section thereof.

Figure 3E:
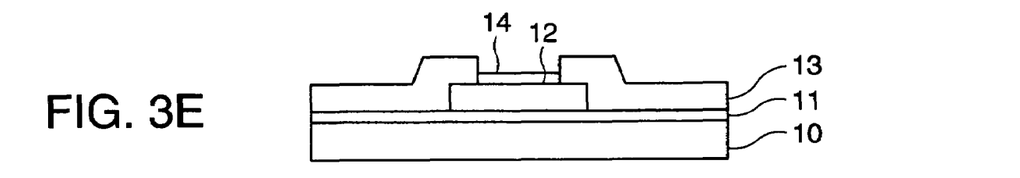

As shown in FIG. 3E, a second insulation film 14 is formed on the semiconductor film 12 exposed from the opening of the insulation film 13. The insulation film 14, which is used as the gate insulation film, needs to be thin and of high withstand voltage. The insulation film 14 can be obtained by, for example, thermal-oxidizing the surface of the polysilicon film, which is the semiconductor film 12, under the plasma atmosphere including oxygen. Thus, the gate insulation film 14 thinner than the insulation film 13 can be formed on the semiconductor film 12 corresponding to the opening section. Since the gate insulation film 14 is displaced form the edge section 12a of the semiconductor film 12 and is not formed on the edge section, the problem of decrease of the film thickness due to the coverage (coverage of the step sections) of the insulation film 14 does not occur.

Figure 3F:
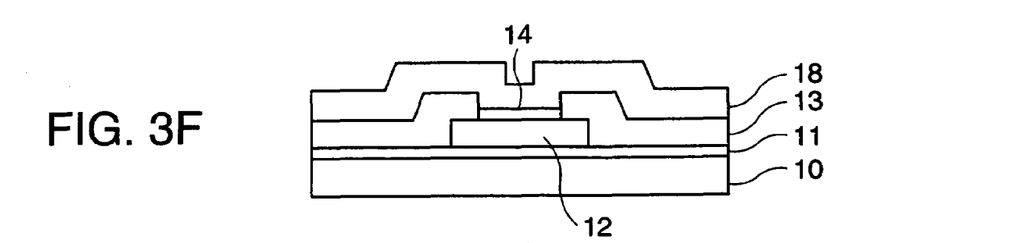

As shown in FIG. 3F, the gate electrode and a wiring film 18 are formed in a predetermined position on the gate insulation film 14 by forming a metal film made of tantalum, aluminum, or the like on the insulation film 13 and the gate insulation film 14 and then patterning the metal film.

Subsequently, using the gate electrode 18 as a mask, impurity ions to be donors or acceptors are implanted into the semiconductor film 12. Thus, the channel forming region is formed under the gate electrode 18, and the source/drain region is formed in the other section (ion-implanted section). A heat treatment is further executed to activate the impurity elements.

Figure 3G:
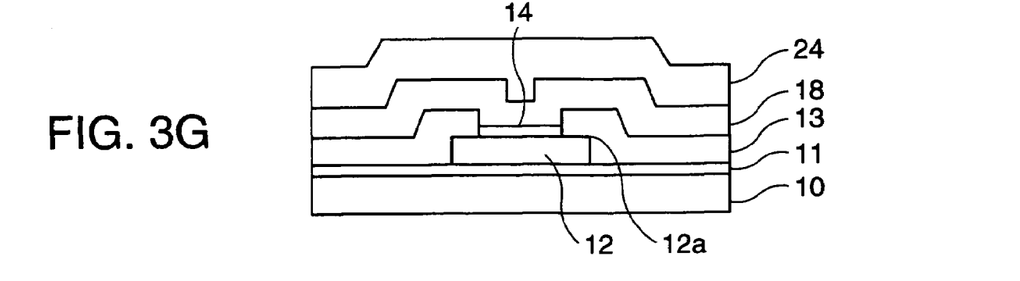

As shown in FIG. 3G, the insulation film 24 is formed on the gate electrode film 18 and the insulation film 13 as a protective film. As the insulation film 24, for example, a silicon oxide film of about 500 nm thick is formed using the PECVD process.

Further, contacting holes 20, 22 passing through the insulation film 24 to reach the source/drain regions are formed. The contacting holes 20 and 22 are formed by forming a mask on the insulation film 24 for opening the contacting hole sections and then executing anisotropic etching on the insulation film 24. Further, by depositing aluminum inside the contacting holes and on the insulation film 24 using a sputtering process and then puttering it, the source electrode 20, the drain electrode 22, and the connection wiring are formed.

As described above, in the exemplary embodiment of the invention, since the gate insulation film is arranged not to be formed on the edge section of the semiconductor film or the step section, the portion where the electric field is concentrated does not appear in the gate insulation film, thus enhancing reliability of the gate insulation film. Further, since the gate insulation film is not configured to cover the step section, film forming or deposition processes having poor efficiency of step coverage can be used for forming the gate insulation film.

Another exemplary embodiment of the manufacturing method of the semiconductor device according to the invention will now be described with reference to FIGS. 4A through 4G. In the drawings, corresponding sections to those shown in FIG. 3 are denoted with the same reference numerals, and the description therefor will be omitted.

In this exemplary embodiment, the gate insulation film 14 is formed using a deposition process. Also in the embodiment, as shown in FIGS. 4A through 4D, the process for forming the semiconductor film 12 on the substrate 10 through the process for opening the insulation film 13 are firstly executed. These processes are the same as the processes (formation of the semiconductor film through formation of the second insulation film) shown in FIGS. 3A through 3D described above, and accordingly the descriptions therefor are omitted.

Figure 4A:
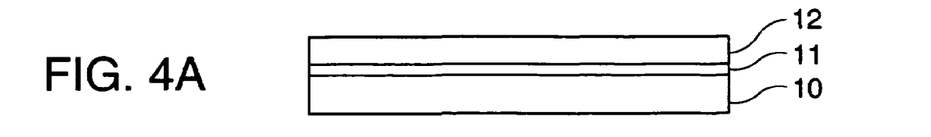
FIGS. 4A through 4G are views for explaining another manufacturing method of a thin film transistor.
Figure 4B:
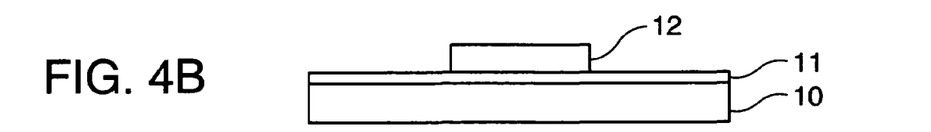
Figure 4C:
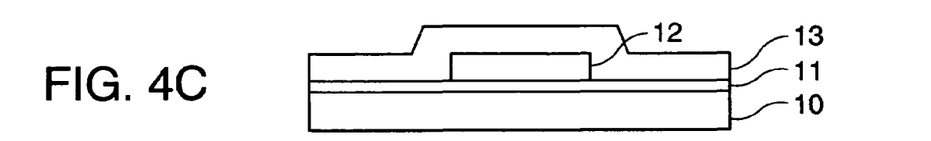
Figure 4D:
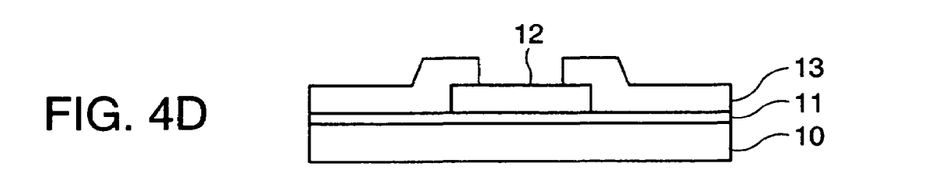
Figure 4E:
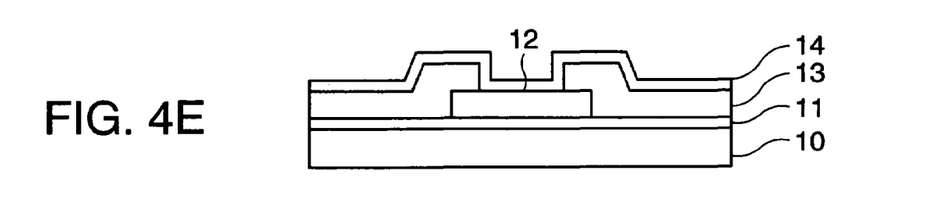

Subsequently, as shown in FIG. 4E, the second insulation film 14 is formed on the insulation film 13 and the semiconductor film 12 exposed from the opening of the insulation film 13. The insulation film 14, which is used as the gate insulation film, needs to be thin and of high withstand voltage. The insulation film 14 forms a gate insulation film 14 made of a silicon oxide film using a deposition process such as a PECVD process. For example, the silicon oxide film is formed using tetraethoxisilane (TEOS) and oxygen ($O_2$) as material gases and under conditions of the flow rates of the gases of 50 sccm and 5 slm, respectively, the atmospheric temperature of 350° C., the RF power of 1.3 kW, and the pressure of 200 Pa. In this case, the film forming rate becomes 30 nm/min, and the excellent silicon oxide film provided with the suitable withstand voltage characteristic for the gate insulation film can be obtained.

Thus, the gate insulation film 14 thinner than the insulation film 13 can be formed on the semiconductor film 12 corresponding to the opening section. Since the gate insulation film 14 is displaced form the edge section 12a of the semiconductor film 12 and is not formed on the edge section, the problem of decrease of the film thickness due to the coverage (coverage of the step sections) of the insulation film 14 does not occur.

Figure 4F:
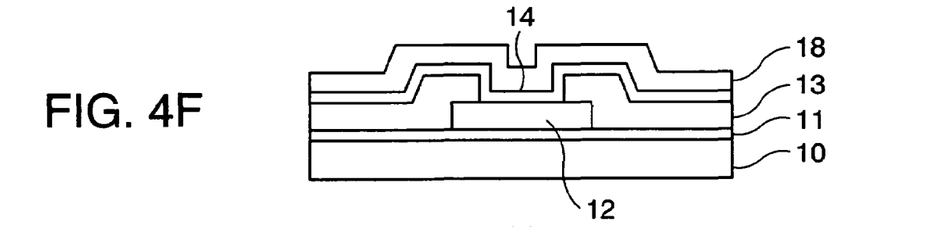
Figure 4G:
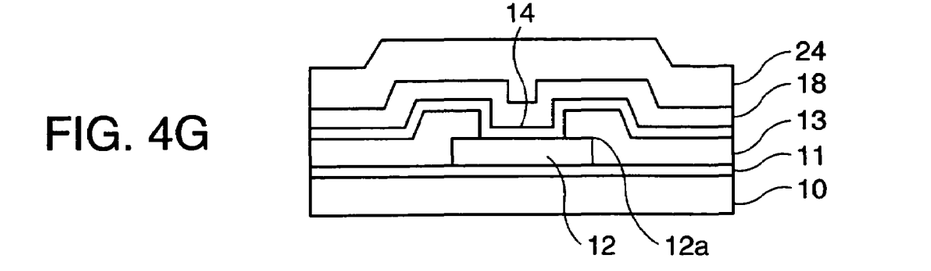

Subsequently, as shown in FIGS. 4F and 4G, formation of the electrode film, formation of the source/drain region, formation of the protective film, and formation of the source/drain electrode wirings are executed through the same processes as shown in FIGS. 3F and 3G described above to complete the thin film semiconductor.

As described above, in the second embodiment of the manufacturing method according to the invention, since the gate insulation film is arranged not to be formed on the edge section 12a of the semiconductor film, the portion where the electric field is concentrated does not appear in the gate insulation film, thus enhancing reliability of the gate insulation film. Further, since the gate insulation film is not configured to cover the edge of the semiconductor film, film forming or deposition processes having poor efficiency of step coverage can be used for forming the gate insulation film.

Hereinafter, some illustrative embodiments of an integrated circuit, an electro-optic device, and an electronic apparatus composed of the semiconductor device described above are now described.

Figure 5:
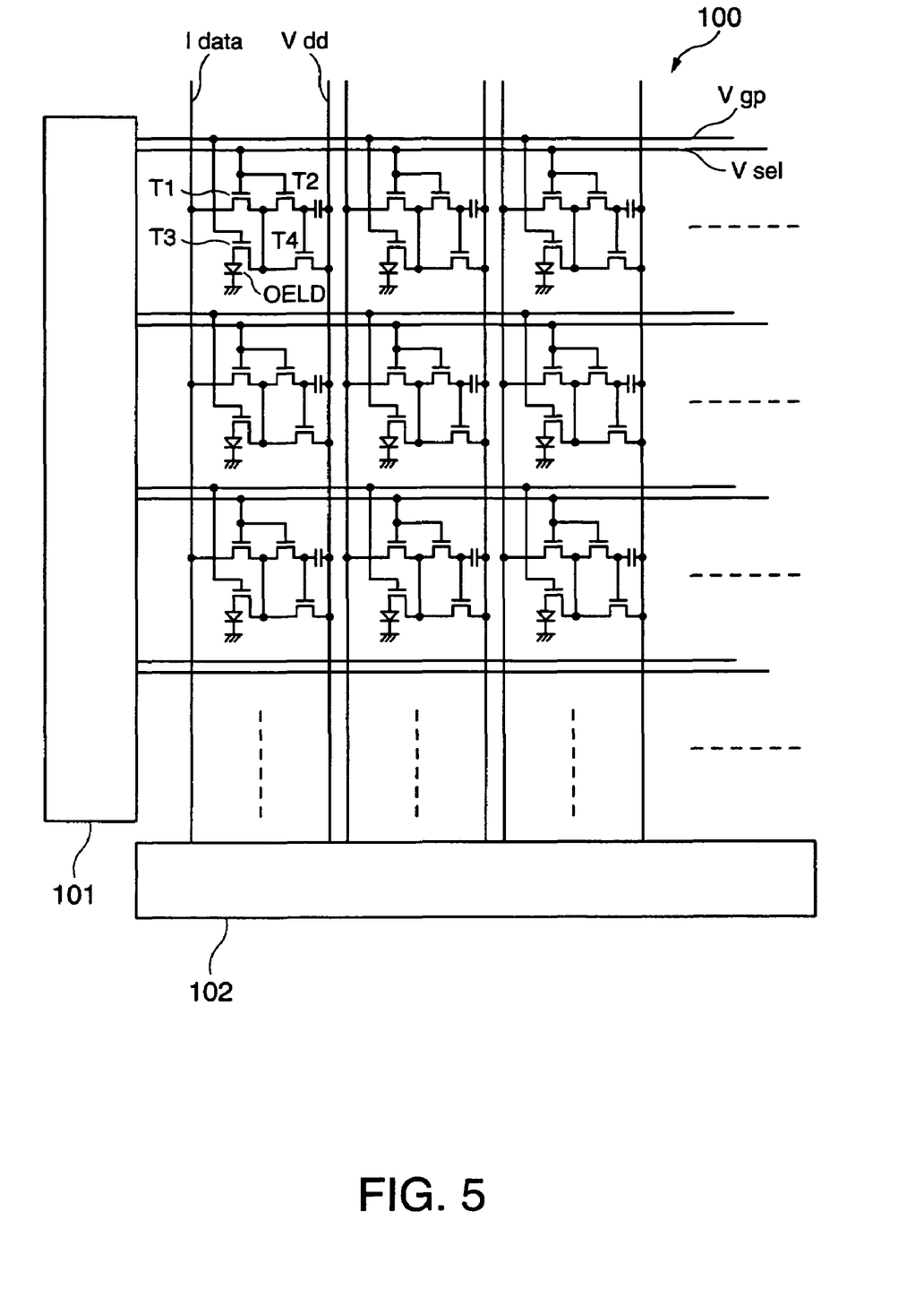
FIG. 5 is a circuit diagram of a electro-optic device composed of the semiconductor device.

FIG. 5 is a circuit diagram of the electro-optic device 100 composed of the semiconductor device. The electro-optic device (display device) 100 according to the exemplary embodiment is equipped for each of pixel regions with a light emitting layer OELD capable of emitting light with an electroluminescence effect and the holding capacitance for storing the value of the current for driving the layer, and further equipped with the semiconductor devices (the thin film transistors T1 through T4) according to the invention. Scanning lines Vsel and light emission control lines Vgp are supplied from the driver 101 to the respective pixel areas. From the driver 102, there are supplied data lines Idata and power supply lines Vdd to the respective pixel areas. By controlling the scanning lines Vsel and the data lines Idata, the current programming to each of the pixel areas is executed, thus the light emission by the light emission section OELD can be controlled.

Note that the driving circuit described above is one example of a circuit for using the electroluminescent elements as the light emitting elements, and other circuit configurations can also be adopted. Further, the integrated circuit forming each of the drivers 101, 102 is also preferably formed using the semiconductor device according to the invention.

Figure 6A:
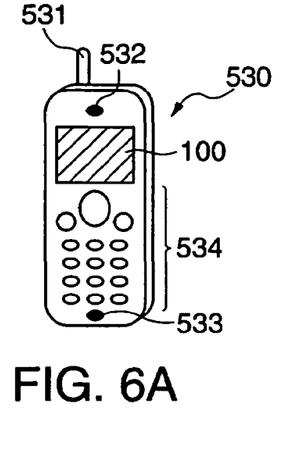
FIGS. 6A through 6D are views for explaining illustrative embodiments of the electronic apparatus.

FIGS. 6A through 6D are views for explaining some illustrative embodiments of electronic apparatus composed of the electro-optic device described above. FIG. 6A shows an application example to a cellular phone, in which the cellular phone 530 is equipped with an antenna section 531, an audio output section 532, an audio input section 533, an operating section 534, and the electro-optic device 100 of the invention. As described above, the electro-optic device according to the invention can be utilized as a display section.

Figure 6B:
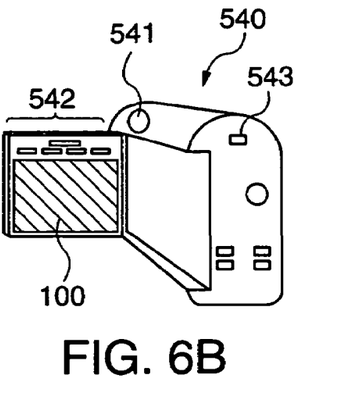

FIG. 6B shows an application example to a video camera, in which the video camera 540 is equipped with a receiver section 541, an operating section 542, an audio input section 543, and the electro-optic device 100 of the invention.

Figure 6C:
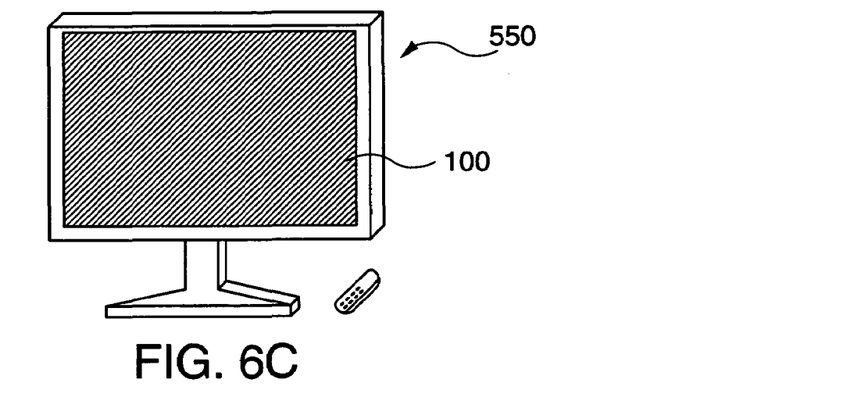

FIG. 6C shows an application example to a television, in which the television 550 is equipped with the electro-optic device 100 of the invention. Note that the electro-optic device according to the invention can also be adopted to the monitors used for personal computers or the like.

Figure 6D:
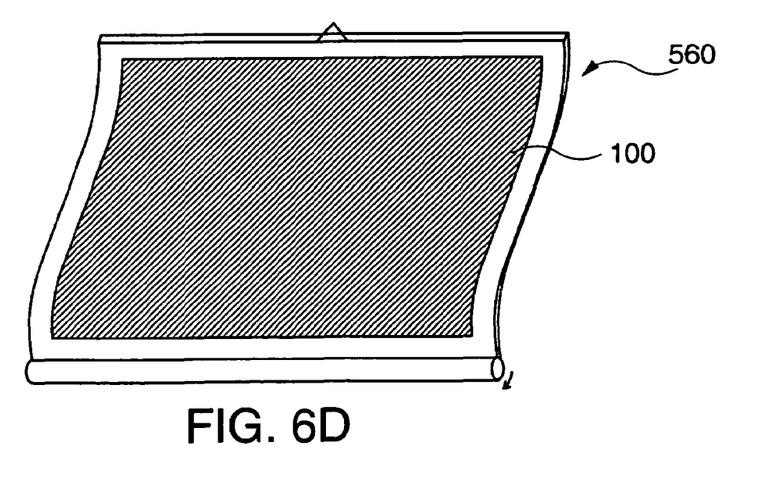

FIG. 6D shows an application example to a roll-up television, in which the roll-up television 560 is equipped with the electro-optic device 100 of the invention.

Further, the electronic apparatus is not limited to these examples, but various electronic apparatuses having a display function can apply the invention. For example, other than the above, a facsimile machine having a display function, a viewfinder of a digital camera, a portable TV, an electronic notepad, an electronic bulletin board, or a display for advertisement are also included. Note that the semiconductor device according to the invention, in addition to the cases in which it is included in the electronic apparatuses described above as a component of the electro-optic device, can be adopted as an independent component of the electronic apparatuses.

Further, it should be understood that the manufacturing method of the semiconductor device according to the invention is not limited to the above, but can be applied for manufacturing various kinds of electronic apparatuses. For example, other than the above, it can also be applied to a facsimile machine having a display function, a viewfinder of a digital camera, a portable TV, a PDA, an electronic notepad, an electronic bulletin board, a display for advertisement, an IC card, or the like.

Note that the invention is not limited to the embodiment described above, but can be put into practice with various modifications within the scope or the spirit of the invention. For example, although the polysilicon film is cited to explain as an example of the semiconductor film in the embodiments described above, the semiconductor film is not limited thereto, but other semiconductor materials can be used. Further, the semiconductor film (silicon film) or the insulation film (silicon oxide film) can be made using a liquid material, such as a solution obtained by dissolving polysilazane in an organic solvent.

Further, although the thin film transistor is cited as one example of field-effect semiconductor element in the above exemplary embodiments, the invention can also be applied other than the above in the same manner to a semiconductor device having a structure in which the element separation is realized by etching between respective transistors in monocrystal SOI (silicon on insulator) transistors.

What is claimed is:

1. A method of manufacturing a semiconductor device, comprising:
   forming a semiconductor film discretely on an insulation substrate; forming a first insulation film on the semiconductor film, the first insulation film covering a surface and a side wall of the semiconductor film;
   providing an opening of the first insulation film to the semiconductor film, the opening being smaller than the semiconductor film and within a surface perimeter of the semiconductor film;
   forming a second insulation film that is thinner than the first insulation film on the semiconductor film corresponding to the opening of the first insulation film; and
   forming an electrode wiring film on the second insulation film and a part of the first insulation film.

2. The method of manufacturing a semiconductor device according to claim 1, forming the semiconductor film further including:
   forming the semiconductor film on the insulation substrate;
   polycrystallizing the semiconductor film by a heat treatment;
   planarizing a surface of the polycrystallized semiconductor film; and
   patterning the polycrystallized semiconductor film to form an element forming region.

3. The method of manufacturing a semiconductor device according to claim 1, forming the second insulating film further including:
   forming the second insulation film by thermal oxidation of the semiconductor film.

4. The method of manufacturing a semiconductor device according to claim 1, forming the second insulating film further including:
   forming the second insulation film by depositing an insulation material on the semiconductor film.

* * * * *

UNITED STATES PATENT AND TRADEMARK OFFICE
CERTIFICATE OF CORRECTION

PATENT NO. : 7,393,724 B2  Page 1 of 1
APPLICATION NO. : 11/107935
DATED : July 1, 2008
INVENTOR(S) : Daisuke Abe It is certified that error appears in the above-identified patent and that said Letters Patent is hereby corrected as shown below:

Title Page; item (54);
In the Title, the portion reading "Electric" should read --Electronic--.

Signed and Sealed this

Twenty-first Day of October, 2008

JON W. DUDAS
*Director of the United States Patent and Trademark Office*

UNITED STATES PATENT AND TRADEMARK OFFICE
CERTIFICATE OF CORRECTION

PATENT NO. : 7,393,724 B2  Page 1 of 1
APPLICATION NO. : 11/107935
DATED : July 1, 2008
INVENTOR(S) : Daisuke Abe

It is certified that error appears in the above-identified patent and that said Letters Patent is hereby corrected as shown below:

Title Page; item (54) and Column 1, line 7;
In the Title, the portion reading "Electric" should read --Electronic--.

This certificate supersedes the Certificate of Correction issued October 21, 2008.

Signed and Sealed this

Eleventh Day of November, 2008

JON W. DUDAS
*Director of the United States Patent and Trademark Office*